United States Patent
Earnshaw et al.

(10) Patent No.: US 9,048,106 B2
(45) Date of Patent: Jun. 2, 2015

(54) SEMICONDUCTOR DIODE ASSEMBLY

(71) Applicant: Diodes Incorporated, Plano, TX (US)

(72) Inventors: John Earnshaw, Sale (GB); Wofgang Kemper, McKinney, TX (US); Yen-Yi Lin, Plano, TX (US); Steve Badcock, Altrincham (GB); Mark French, Sale (GB)

(73) Assignee: Diodes Incorporated, Plano, TX (US)

( * ) Notice: Subject to any disclaimer, the term of this patent is extended or adjusted under 35 U.S.C. 154(b) by 72 days.

(21) Appl. No.: 13/713,243

(22) Filed: Dec. 13, 2012

(65) Prior Publication Data

US 2014/0167204 A1 Jun. 19, 2014

(51) Int. Cl.
*H01L 29/06* (2006.01)
*H01L 29/861* (2006.01)
*H01L 27/02* (2006.01)

(52) U.S. Cl.
CPC .......... *H01L 29/0607* (2013.01); *H01L 29/861* (2013.01); *H01L 27/0255* (2013.01)

(58) Field of Classification Search
CPC .............. H01L 29/0607; H01L 29/861; H01L 29/8611
USPC .......................................................... 257/490
See application file for complete search history.

(56) References Cited

U.S. PATENT DOCUMENTS

| 2009/0045457 A1* | 2/2009 | Bobde ........................... 257/328 |
| 2012/0142171 A1* | 6/2012 | Marreiro et al. .............. 438/478 |

* cited by examiner

*Primary Examiner* — Long K Tran

(57) ABSTRACT

TSV devices with p-n junctions that are planar have superior performance in breakdown and current handling. Junction diode assembly formed in enclosed trenches occupies less chip area compared with junction-isolation diode assembly in the known art. Diode assembly fabricated with trenches formed after the junction formation reduces fabrication cost and masking steps increase process flexibility and enable asymmetrical TSV and uni-directional TSV functions.

16 Claims, 4 Drawing Sheets

SEMICONDUCTOR DIODE ASSEMBLY

BACKGROUND

Over-voltage transients in the form of electro-static discharge, electromagnetic interference, lighting, or in other harmful forms can strike integrated circuit (IC) packages unexpectedly. Therefore, transient suppressing measures are often necessary to ensure normal functionality over the expected life span of the packaged circuits.

In electronic systems such as cell phones, laptop computers, handheld GPS systems, or digital cameras where space is severely limited, transient voltage suppressor (TVS) devices made of semiconductor are the only viable choice to protect the sensitive IC chips in the systems. To merge the TVS functionality into the chips to be protected is mostly impractical because fabrication processes designed for most integrated circuits do not lend themselves to good TVS performance. For this reason, stand-alone semiconductor TVS devices remain the choice in the industry.

In the TVS devices, p-n junctions and the associated depletion regions combined with the resistive elements are designed to absorb the damaging energy of the transient strikes. As the transients are often manifested as fast, high voltage pulses, TVS devices are configured to force the p-n junctions into breakdown and thus divert the energy through these junctions rather than through the protected circuits.

Known TVS devices are built based on diffused lateral p-n junction diodes in silicon chips comprised of epitaxial silicon on a heavily doped n-type substrate. The diodes are fabricated by implanting or diffusing p-type dopant through windows openings cut through a grown or deposited oxide layer over the silicon to form p-n junctions under the silicon surface. A p-n junction thus formed has two parts—a relatively planar portion at a fixed distance from the surface of the silicon, and a non-planar cylindrical portion, which surrounds the planar portion at the periphery extending to the silicon surface. These p-n junctions are responsible to by-pass potentially damaging energy from the protected circuits without themselves suffering permanent damage.

SUMMARY OF THE INVENTION

The Applicants observed and recognized that the breakdown voltage of a diffused p-n junction often falls short of the theoretical value and is a function of the depth of the diffused region, with shallower junctions exhibiting a more pronounced reduction in breakdown voltage, and that this reduction is due to the radius of curvature of the non-planar, cylindrical portion of the junction, which causes the junction break down to occur near the surface of the silicon rather than in the planar region of the diode beneath the surface. Because junction breakdown under electrical stress induces high current density at the limited area curved portion of the p-n junction, the heat will damage such a TVS device prematurely.

With this recognition, Applicants endeavoured to invent, as will be described in detail in this paper, processes for making devices that are suitable for TVS devices with superior performance. The TVS devices that embody the invention contain electrical circuit path with at least two terminals that are accessible from the top surface of the device and along the electrical path there is at least one but no more than two p-n junctions, which are practically planar across the junction area and are therefore free of weak spots associated with non-planar junctions.

The TVS devices that embody this invention can be either bi-directional devices or unidirectional devices and they provide protection to electronic circuits against voltage transients and other electrical surges and spikes, where such transients are either positive or negative. Because the junctions are planar with no cylindrical portion, the devices are able to absorb larger transient pulses than those that are known at the time of this invention.

Other aspects of this invention include placing the j-n junctions in trench-enclosed columns of semiconductor material so the devices can be realized in tiny semiconductor dies or chips. The trench may assume the shape of a ring that is circular, oval, rectangular, square, polygonal, or it may be non-geometrical—as long as it forms a close-looped ring that is without a gap.

Other aspects of this invention include introducing dopant into semiconductor material in multiple trenches without covering portions of die with a photo-making material so devices that embody this invention may breakdown symmetrically with respect to the two terminals of the electrical circuit path. One advantage of this is that the devices can be made with less complication and lower cost.

Another aspect of this invention is that by inserting a masking layer, bi-directional devices with asymmetric breakdown voltages can be realized. And with one further additional masking layer, unidirectional devices, which provide TSV protection in only one direction with respect to the two terminals, can also be realized.

In summary, the invention enables a person skilled in the art of semiconductor devices to fabricate and use among other implementations, TVS devices that can absorb a larger quantity of energy in the form of a transient voltage surge and recover from it than achievable in the known art because they can achieve junction breakdown voltages closer to the theoretical value and across the entire p-n junction area. Many devices that embody this invention have terminals accessible from their top surface alone and thus facilitate device packaging for low cost and high packing density.

Exemplary embodiments of this invention are described, with aid of drawings, in the following sections.

BRIEF DESCRIPTION OF THE DRAWING FIGURES

DETAILED DESCRIPTION OF EXEMPLARY EMBODIMENTS

EXAMPLE 1

A Symmetrical Bi-directional Transient Suppressor

Figure 1:
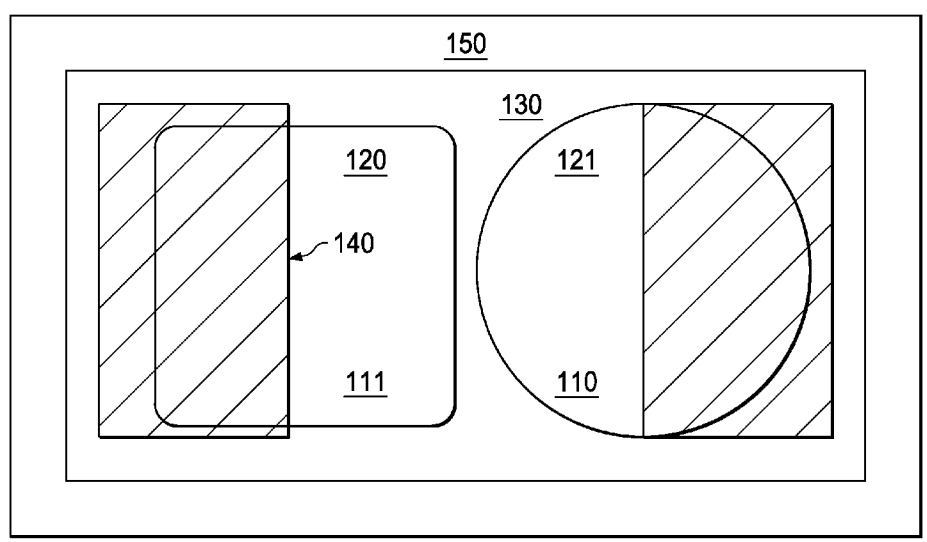
FIG. 1 depicts the top view of an exemplary device that embodies aspects of this invention.

FIG. 1 depicts the top surface of a partially completed exemplary semiconductor device chip 100 embodying certain aspects of this invention. The chip as depicted has two trenches 110 and 111 located at the middle portion of the chip. Although one circular trench and one square trench are depicted they may be replaced by other shapes such as oval, oblong, polygon and non-geometrical trenches. Each of the trenches 110 and 111 is depicted as fully enclosing a columnar region of the semiconductor material that makes up the device chip 100. In this example, the semiconductor material is silicon but other semiconductor materials such as silicon carbide, gallium nitride, gallium arsenide, etc. are also contemplated.

The inside diameter of the circular trench of this exemplary device 150 µm, and the trench width is 1.5 µm. Trenches are etched into the silicon chip from its top surface with the chip still a part of a silicon wafer. Although in the exemplary chip trenches are etched perpendicularly with respect to the chip surface, angular etch such that trenches extending into the silicon chip at an angle other then 90 degrees with respect to the chip surfaces is also contemplated.

Also depicted in FIG. 1 are contacts 120 and 121 through which the silicon makes contact to metal members 130. In this exemplary chip, the contacts are composed of cluster of contact holes 3 µm in diameter. The metal members 130 are depicted as being close to square with a layer of protective overcoat 150 over the majority of the metal areas including the contact areas. Window openings 140 are etched through the protective overcoat 150 so the metal members exposed through the windows can connect the chip 100 to other circuit components placed on, for example, a printed circuit board (PCB.)

The chip 100 as depicted has borders severed with tools such as a circular saw from a silicon wafer at the end of wafer processing. It is evident when the chip 100 is packaged in a chip-scale-package (CSP,) the characteristic circular saw marks are visible at the four edges of the package. Other tools such as laser and water jet for severing chips from silicon wafers are also contemplated.

The chip as depicted in FIG. 1 may also be packaged with, for example, plastic molding compound after being die bonded to a lead frame. Devices in the form of CSP devices, however, may be incorporated easily into a PCB by placing solder on the metal member 130 through the windows 140 and soldered directly on the surface of or embedded in a PCB.

Figure 2:
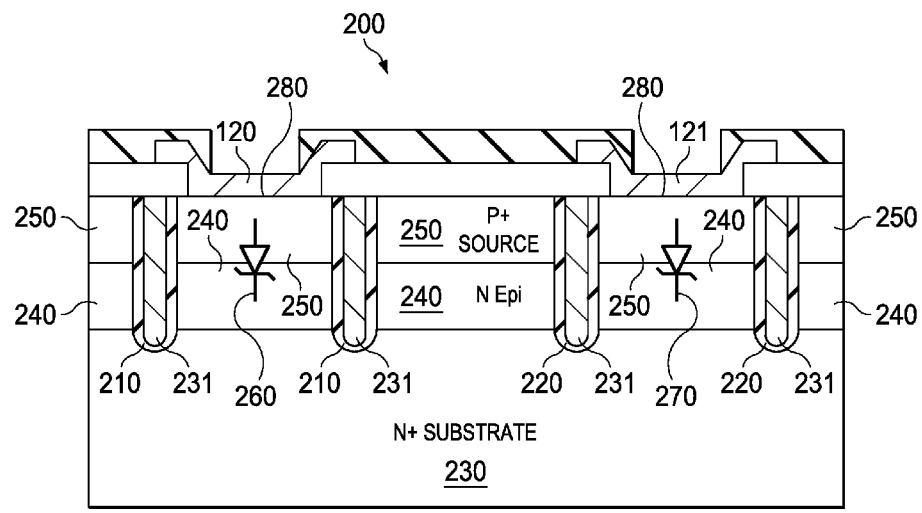
FIG. 2 depicts a cross-sectional view of an exemplary device that embodies aspects of this invention.

FIG. 2 depicts a cross-sectional view of an exemplary semiconductor chip 200. Exemplary chip 200 comprises three layers of silicon designated by reference numerals 230, 240, and 250. Layer 230 is an n+ silicon substrate; layer 240 is a layer of epitaxial silicon grown on top of the substrate; and layer 250 is a doped layer within the epitaxial silicon. For cost and performance consideration, it is often advantageous to build this device on a heavily doped substrate wafer with a lightly doped silicon epitaxial layer grown on the surface of the substrate. In this exemplary chip, the layer 230 has the highest dopant concentration, and the layer 240 has the lowest dopant concentration. The combination of the substrate and the grown epitaxial layer may have a thickness, depending on the diameter of the substrate wafer, ranging from 300 µm in case of a 2 to 3 inch wafer to about 800 µm in case of a 12 inch wafer. Larger and thicker wafers are also contemplated. At the end of the wafer processing, the wafer may be ground to the final thickness of only 100 µm to 200 µm before the chip is severed, depending on the form of the final packaging. The grinding may be evident when viewing the non-contacting surface of chip 200 in a CSP package. As is depicted in FIG. 2 the chip has an n-type substrate but, depending on the application of the device, p type substrates instead may also be used, as will be demonstrated in a later example.

Layer 250 depicted in FIG. 2, is a layer of silicon more heavily doped with p-type dopant to overcome the original n-type doping concentration in the epitaxial layer. This p-type layer may be created by implanting p-type ions such as boron or aluminum into the n-type epitaxial silicon layer 240 followed by an anneal step and thus forms two p-n junctions 260 and 270 in the enclosed semiconductor columns 210 and 220 respectively. The p-n junctions may also be formed by a dopant deposition step instead of by ion-implantation, and followed by a drive-in step. The layer 250 is referred in this paper as the source layer and has an exemplary thickness of about 1 µm.

FIG. 2 also depicts the cross section of the two trenches 210 and 220. The trenches may be etched after the epitaxial layer 240 is grown on the substrate 250 and after the layer 250 is formed as part of the epitaxial layer. For this exemplary device chip, the tips of both trenches penetrate well into the substrate. In other exemplary devices, the depth of penetration may be shorter so the trenches terminate within the epitaxial layer 240, which in this exemplary chip is lightly doped n-type silicon with a thickness of 4 to 5 µm. In other designs, the epitaxial layer may be p-type silicon and of a different thickness and dopant concentration. Because the layers 240 and 250 are formed before the trenches are etched, this is one way to ensure that the junctions are planar as depicted in FIG. 2, without the curved and cylindrical structure known in the art.

The regions between the walls of the trench are filled with a substance, which maybe electrically conductive such as doped polysilicon, or metal such as tungsten; or electrically insulating, such as silicon dioxide. In case the filling material is conductive, the trench walls may be first lined with electrically insulating material 231, such as silicon dioxide, or nitride.

The Applicants have determined that the inventive p-n junctions fabricated following this method are advantageous compared to known diffused p-n junctions that include both planar portion and non-planar portion. As absented by the Applicants, the inventive junction does not have non-planar portions that break down prior to the planar portion. Therefore when the planar junction does breakdown at the expected higher voltage level, the entire junction area tends to breakdown simultaneously and with the entire junction area spreading the breakdown current, the current density stays lower than if only a small portion have to pass the current in its entirety such as in the known art, Therefore, the chip, as depicted in FIG. 2, outperforms devices known in the art in many aspects.

Another advantageous aspect of the invention is that the two p-n junctions depicted in FIG. 2 are joined by the n+ substrate in a back-to-back configuration so electrically the combination of the two p-n junctions is accessible from the top surface of the chip 280. This is advantageous when the chip is assembled, for example, in CSP package as it can be readily incorporated into PCBs with the connections all in one surface.

Electrically the chip depicted in FIG. 2 is symmetrical with respect to the contacts 120 and 121. This configuration is suitable for applications where expected electrical transients of opposite polarities are approximately of equal amplitudes and durations.

Figure 3:
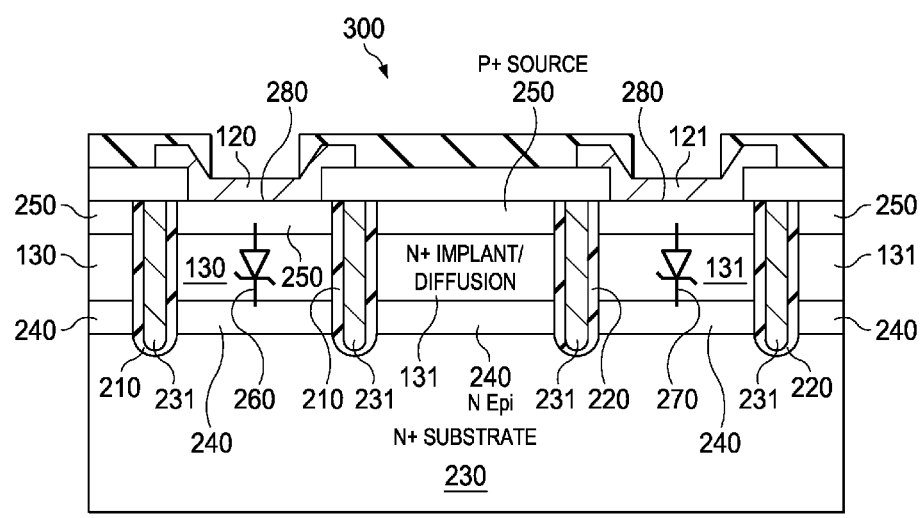
FIG. 3 depicts a cross-sectional view of another exemplary device that embodies aspects of this invention.

FIG. 3 depicts another exemplary back-to-back p-n junction pair 300 that has symmetrical electrical characteristics. This device, as depicted in FIG. 3, is different from that depicted in FIG. 2 in that a silicon layer 130, 131, which are adjacent to the p+ layer, are n-type and are doped more heavily than the epitaxial silicon. The doping of this layer may be the result of additional ion implantation of an n-type species such as, for example, phosphorus or arsenic either before or after the formation of the p+ layer.

The more heavily doped layers 130 and 131 yield a predictably lower junction breakdown voltage than without the layers and this exemplary device is suitable for applications where the transient amplitudes may be lower than the cases in the previous example.

Device 300 retains the symmetrical characteristic as device 200 depicted in FIG. 2. The two p-n junctions of device 300 are fabricated with the identical n+ implant and p+ implant steps so no masking is required.

EXAMPLE 2

An Asymmetrical Bi-directional Transient Suppressor

Figure 4:
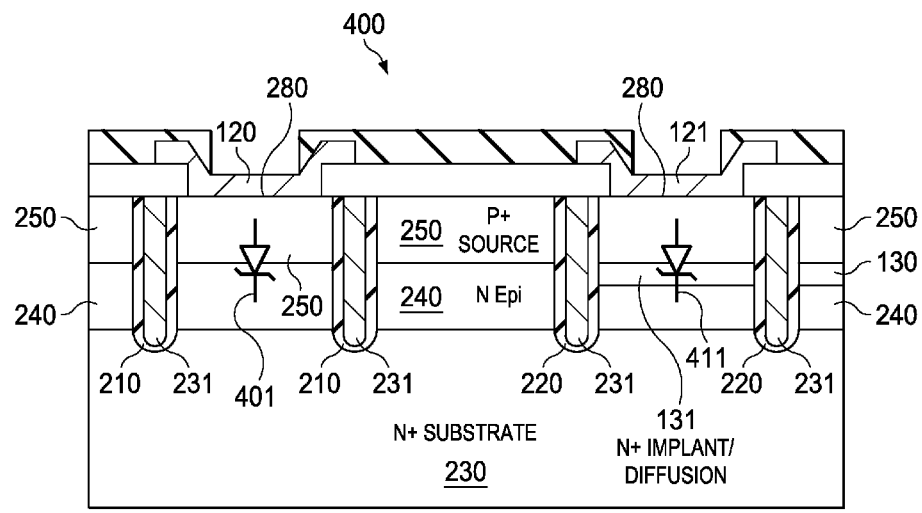
FIG. 4 depicts a cross-sectional view of another exemplary device that embodies aspects of this invention.

FIG. 4 depicts another exemplary device 400. The main difference between device 400 and device 300 depicted in FIG. 3 is that the layer 130 in FIG. 3 is absent from the vicinity of the p-n junction diode 401 on the left side of FIG. 4 but is present near the p-n junction on the right side of FIG. 4. This is accomplished with a masking operation that covers the diode area during the ion implant step resulted in the n-layer near the junction diode 411. As a result, the junction breakdown of the diode 411 will be lower by a predictable voltage than that of the diode 401. This device is advantageous in applications where the expected voltage transients are higher with one polarity over the opposite polarity.

EXAMPLE 3

Another Symmetrical Bi-directional Transient Suppressor

Figure 5:
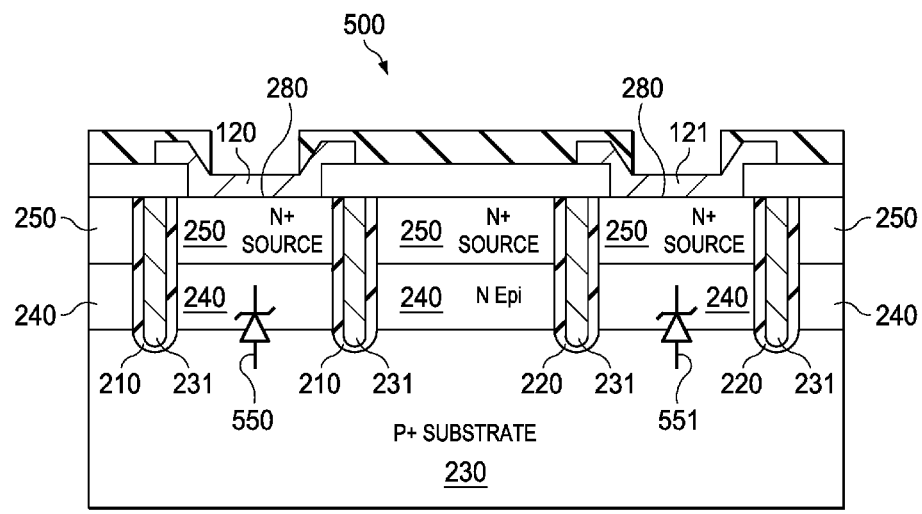
FIG. 5 depicts a cross-sectional view of another exemplary device that embodies aspects of this invention.

FIG. 5 depicts yet another exemplary device 500. Device 500 as depicted is a, bi-directional, symmetrical transient suppressor. The main difference between device 500 and device 200 is that in device 500 the substrate 230 and the epitaxial layer 240 are of the opposite doping type while in the device 200, they are of the same polarity.

As a consequence, the p-n junctions 550 and 551 in device 500 are formed between the substrate and the epitaxial layer. In this exemplary device, as well as in the previous devices, because the, diode junctions 550 and 551 are planar, they also are advantageous over non-planar junctions in the known art. Furthermore because the doping concentrations of the substrate and the epitaxial layer can be controlled more tightly than that of the implanted or diffused layer, the control over the junction breakdown voltage may also be tighter.

EXAMPLE 4

A Uni-Directional Transient Suppressor

Figure 6:
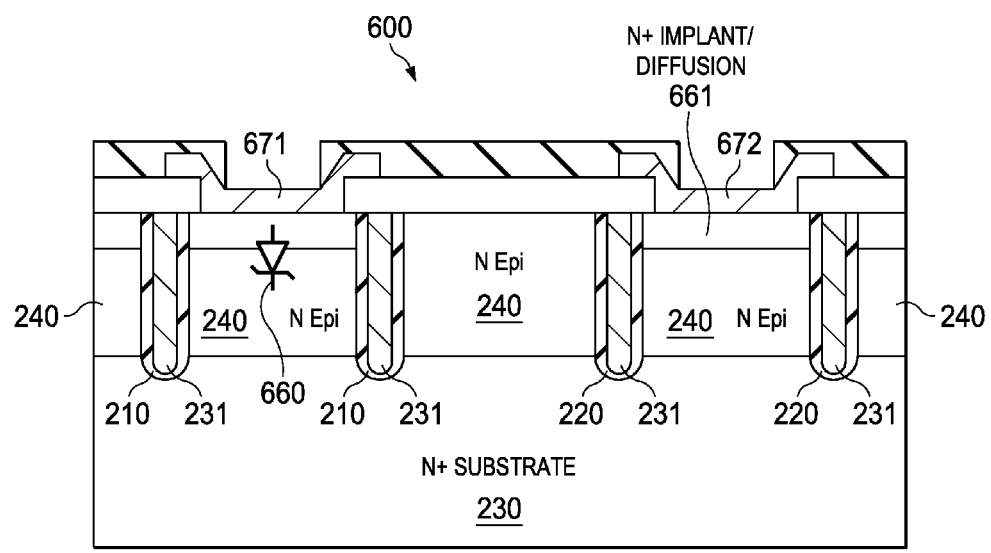
FIG. 6 depicts a cross-sectional view of another exemplary device that embodies aspects of this invention.

FIG, 6 depicts yet another exemplary device 600. Device 600 is built on an n+substrate 230 and an n-type epitaxial layer 240 grown over the substrate. But unlike in device 100, 300, 400, and 500, p-n junction 660 is only formed in the first trench enclosed column of semiconductor material and not in the second trench enclosed column of semiconductor material 661. Instead, n-type dopant is introduced into the surface region of the epitaxial layer so that the silicon column enclosed by the trench on the right side of FIG. 6 is without a p-n junction, and is of the same doping type from the top of the epitaxial layer to the substrate.

With this configuration, the device 600 is accessible from the top surface of the chip but the electrical circuit between the two terminals 671 and 672 contains only one p-n junction 660. Therefore it functions to arrest only transients of one single polarity with respect to the terminals 671 and 672.

Summarily, the above examples are demonstrative only and not limiting. Other embodiments of this invention may be realized by a person skilled in the art of semiconductor device design and fabrication after reading this paper, which includes the drawing figures. For example, the dopant distribution may be tailored in the columnar semiconductor material by ion implants of various elements and implant energies to modify the p-n junction breakdown voltage and the behavior of the depletion regions associated with the junctions. The trenches in one chip may or may not have the same shaped rings.

Furthermore, depending on how the invention embodying chips are packaged, the surfaces of the chip opposite to the contact side and which is ground before the wafer sawing step, along with the sawed edges may be exposed from the packages or they may be covered by conductive films or dielectric material, or they may go through other treatments in order to protect the chip from harsh environment under which they are designed to function.

These are also considered to be within the scope of this invention, of which the scope is only limited by the claims.

We claim:

1. A semiconductor chip having a front surface and a back surface, comprising
    a substrate of a semiconductor material extending to the back surface of the chip;
    a layer of epitaxial semiconductor material extending from the substrate to the front surface of the chip;
    a pair of columns of semiconductor material, each enclosed by a trench structure, which extends from the front surface of the chip and towards the substrate;
    each of the pair of columns containing no more than one p-n junction, which is co-extensive with radial cross sections of the respective column; and
    a pair of electrical terminals, each contacting one of the pair of columns of semiconductor material at the front surface of the chip, forming between the terminals an electric circuit that contains at least one and no more than two p-n junctions.

2. The semiconductor chip of claim 1, in which the trenches that enclose the pair of the columns of semiconductor material extend into the substrate.

3. The semiconductor chip of claim 1, In which the trenches that enclose the pair of he columns of semiconductor material terminate before they reach the substrate.

4. The semiconductor chip of claim 1, in which the substrate and the epitaxial layer do not form a p-n junction at their interface.

5. The semiconductor chip of claim 1, in which the no more than one p-n junction in each of the pair of columns is planar.

6. The semiconductor chip of claim 1, further comprising a filler material within the trenches that enclose the pair of columns of semiconductor material.

7. The semiconductor chip of claim 6, in which the filler material is a dielectric material isolating the column of semiconductor material enclosed by the respective trench.

8. A package, comprising:
    a semiconductor chip having orthogonal outside surfaces including a top surface and a bottom surface;
    a ring-shaped first trench structure extending from the top surface of the chip towards the bottom surface of the chip, enclosing a first column of semiconductor material;

a ring-shaped second trench structure extending from the top surface of the chip towards the bottom surface of the chip, enclosing a second column of semiconductor material;

a first metal element contacting the first column of semiconductor material at the top surface of the semiconductor chip; and a second metal element contacting the second column of semiconductor material at the top surface of the semiconductor chip, and an electrical circuit through the first column of semiconductor material and the second column of semiconductor material and including one or at most two p-n junctions between the first metal element and the second metal element.

9. The package of claim 8, in which five outside surfaces are semiconductor surfaces.

10. The semiconductor chip of claim 9, in which the first parallel portion of epitaxial semiconductor material and the second parallel portion of epitaxial semiconductor material form a p-n junction at their interface.

11. The semiconductor chip of claim 10, in which the second conductive type is n-type and the second concentration is higher at near the second parallel portion of epitaxial semiconductor material than at near the substrate.

12. The semiconductor chip of claim 8, further comprising a substrate portion containing a first type of conductive dopant; and a first parallel portion of epitaxial semiconductor material of a second type of conductive dopant of a second concentration between the substrate and a second parallel portion of epitaxial semiconductor material of a third conductive type of a third dopant concentration.

13. The semiconductor chip of claim 12, in which the third conductive type is p-type and the third dopant concentration is higher than the second dopant concentration.

14. The semiconductor chip of claim 13, in which the first type is n-type.

15. The semiconductor chip of claim 8, in which the first type is p-type and the second type and the third type are n-type.

16. A semiconductor chip of claim 8, in which the first type, the second type, and the third type are n-type.

* * * * *